(12) United States Patent
Bahnsen et al.

(10) Patent No.: US 9,454,214 B2
(45) Date of Patent: Sep. 27, 2016

(54) MEMORY STATE MANAGEMENT FOR ELECTRONIC DEVICE

(71) Applicant: Intel Corporation, Santa Clara, CA (US)

(72) Inventors: Robert B. Bahnsen, Tacoma, WA (US); Kanivenahalli Govindaraju, Federal Way, WA (US); Robert C. Swanson, Olympia, WA (US); Mallik Bulusu, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 215 days.

(21) Appl. No.: 13/795,439

(22) Filed: Mar. 12, 2013

(65) Prior Publication Data

US 2014/0281637 A1 Sep. 18, 2014

(51) Int. Cl.
*G06F 1/32* (2006.01)
*G11C 11/4074* (2006.01)

(52) U.S. Cl.
CPC ......... *G06F 1/3275* (2013.01); *G11C 11/4074* (2013.01); *Y02B 60/1228* (2013.01); *Y02B 60/32* (2013.01)

(58) Field of Classification Search
CPC .. G06F 1/3275; G06F 1/3287; G06F 1/3206; G06F 3/0625
USPC ........................................................ 713/324
See application file for complete search history.

(56) References Cited

U.S. PATENT DOCUMENTS

| | | | |
|---|---|---|---|
| 5,524,248 A * | 6/1996 | Parks et al. ................ | 713/324 |
| 5,860,106 A * | 1/1999 | Domen et al. ............. | 713/324 |
| 5,928,365 A * | 7/1999 | Yoshida .................... | 713/324 |
| 6,766,420 B2 * | 7/2004 | Rawson, III ............... | 711/133 |
| 2003/0131206 A1 * | 7/2003 | Atkinson et al. .......... | 711/156 |
| 2007/0291571 A1 * | 12/2007 | Balasundaram .......... | 365/227 |
| 2011/0296095 A1 * | 12/2011 | Su et al. .................... | 711/105 |
| 2013/0073886 A1 * | 3/2013 | Zaarur ....................... | 713/320 |
| 2014/0181558 A1 * | 6/2014 | Taha et al. ................ | 713/323 |

* cited by examiner

*Primary Examiner* — Vincent Tran
(74) *Attorney, Agent, or Firm* — Thorpe North & Western, LLP

(57) ABSTRACT

In one embodiment a controller comprises logic to determine whether an electronic device is operating in a low power state and in response to a determination that the electronic device is operating in a low power state, implement a memory state management routine which reduces power to at least a section of volatile memory in the memory system. Other embodiments may be described.

24 Claims, 8 Drawing Sheets

MEMORY STATE MANAGEMENT FOR ELECTRONIC DEVICE

RELATED APPLICATIONS

None.

BACKGROUND

The subject matter described herein relates generally to the field of electronic devices and more particularly to a memory state management for electronic devices.

Mobile electronic devices such as, e.g., laptop computers, notebook computers, tablet computers, mobile phones, electronic readers, and the like are commonly powered by one or more batteries. Many mobile devices are rarely turned off. Rather, users allow the devices to enter a sleep state in which various system components are placed in a low-activity state for extended periods of time to save power. A memory system is one of the consumers of power in an electronic device. Accordingly systems and methods to manage memory systems may find utility.

BRIEF DESCRIPTION OF THE DRAWINGS

The detailed description is described with reference to the accompanying figures.

DETAILED DESCRIPTION

Figure 1:
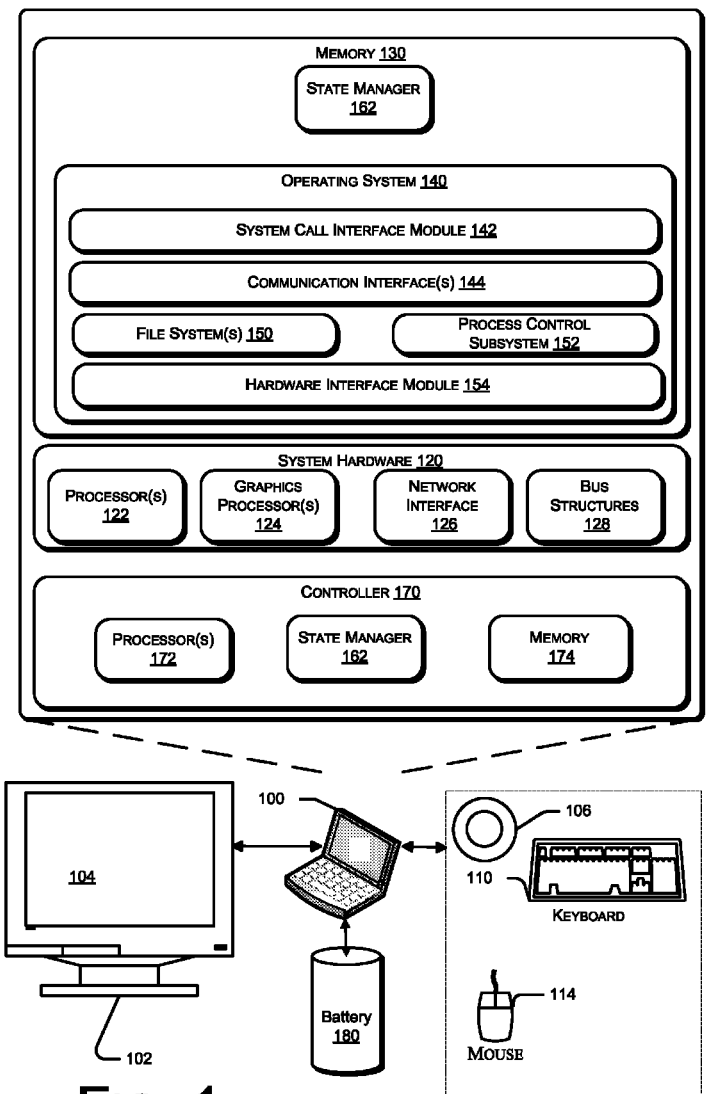
FIGS. 1 and 2 are high-level schematic illustrations of an electronic device which may be adapted to include battery power management in accordance with some embodiments.

Described herein are exemplary systems and methods to implement memory state management in electronic devices. Memory systems may include a volatile memory such as Dynamic Random Access Memory (DRAM), which frequently functions as cache memory, and nonvolatile memory such as phase change memory, NAND memory or the like or even magnetic or optical memory. Volatile memory generally exhibits faster response times (i.e., lower latency) but consumes more power, at least in part due to refresh requirements. During operation of the electronic device it may be beneficial to store data in DRAM memory for highest possible memory bandwidth. However there may be long periods of time when an electronic device is not under heavy use. During periods of inactivity it may be beneficial to implement memory state management to manage memory operations in a way that balances performance requirements with power conservation.

In a two level memory (2LM) the physical memory address space is mapped to a nonvolatile memory. There is also a large volatile memory (i.e., DRAM) cache to keep performance high, as the nonvolatile memory technology has higher latency and lower bandwidth than standard DRAM. The nonvolatile memory consumes little power at idle, unlike DRAM, which consumes considerable power during idle. In embodiments described herein relatively more data is kept in the DRAM under heavy load and less data in DRAM during low utilization. In each case all data is kept in the nonvolatile memory store, but the size of the DRAM cache may be adjusted to save power.

DRAM memory is generally managed using memory tables which map logical addresses onto the underlying physical memory structure and which maintain state information about the memory. Example states are modified (M), Exclusive (E), shared (S), and invalid (I). In accordance with embodiments described herein a new memory state unused (U) is introduced. Memory may be placed into the U state when the electronic device is in a low activity state. When memory is placed in a U state, the DRAM cache size can be reduced either by suspending refresh operations to memory in the U state or by writing data from the volatile memory back to the nonvolatile memory and then powering down the volatile memory.

Thus, when an electronic device is in a low-activity state (e.g., a sleep state) the memory system may suspend operations of some or all of the volatile memory in order to conserve power. In some embodiments the amount of volatile memory that is suspended may be managed dynamically by setting a threshold target for a performance parameter such as the cache miss rate. If the cache miss rate is below a threshold then additional volatile memory may be taken off line to conserve power. By contrast, if the cache miss rate exceeds a threshold then volatile memory may be brought back online.

In the following description, numerous specific details are set forth to provide a thorough understanding of various embodiments. However, it will be understood by those skilled in the art that the various embodiments may be practiced without the specific details. In other instances, well-known methods, procedures, components, and circuits have not been illustrated or described in detail so as not to obscure the particular embodiments.

FIG. 1 is a schematic illustration of an exemplary electronic device 100 which may be adapted to implement battery power management as described herein, in accordance with some embodiments. In one embodiment, electronic device 100 includes one or more accompanying input/output devices including a display 102 having a screen 104, one or more speakers 106, a keyboard 110, and a mouse 114. In various embodiments, the electronic device 100 may be embodied as a personal computer, a laptop computer, a personal digital assistant, a mobile telephone, an entertainment device, or another computing device.

The electronic device 100 includes system hardware 120 and memory 130, which may be implemented as random access memory and/or read-only memory. A power source such as a battery 180 may be coupled to the electronic device 100.

System hardware 120 may include one or more processors 122, one or more graphics processors 124, network interfaces 126, and bus structures 128. In one embodiment, processor 122 may be embodied as an Intel® Core2 Duo® processor available from Intel Corporation, Santa Clara, Calif., USA. As used herein, the term "processor" means any type of computational element, such as but not limited to, a microprocessor, a microcontroller, a complex instruction set computing (CISC) microprocessor, a reduced instruction set (RISC) microprocessor, a very long instruction word (VLIW) microprocessor, or any other type of processor or processing circuit.

Graphics processor(s) 124 may function as adjunct processor that manages graphics and/or video operations.

Graphics processor(s) 124 may be integrated onto the motherboard of electronic device 100 or may be coupled via an expansion slot on the motherboard.

In one embodiment, network interface 126 could be a wired interface such as an Ethernet interface (see, e.g., Institute of Electrical and Electronics Engineers/IEEE 802.3-2002) or a wireless interface such as an IEEE 802.11a, b or g-compliant interface (see, e.g., IEEE Standard for IT-Telecommunications and information exchange between systems LAN/MAN—Part II: Wireless LAN Medium Access Control (MAC) and Physical Layer (PHY) specifications Amendment 4: Further Higher Data Rate Extension in the 2.4 GHz Band, 802.11G-2003). Another example of a wireless interface would be a general packet radio service (GPRS) interface (see, e.g., Guidelines on GPRS Handset Requirements, Global System for Mobile Communications/GSM Association, Ver. 3.0.1, December 2002).

Bus structures 128 connect various components of system hardware 128. In one embodiment, bus structures 128 may be one or more of several types of bus structure(s) including a memory bus, a peripheral bus or external bus, and/or a local bus using any variety of available bus architectures including, but not limited to, 11-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCMCIA), and Small Computer Systems Interface (SCSI).

Memory 130 may store an operating system 140 for managing operations of electronic device 100. In one embodiment, operating system 140 includes a hardware interface module 154, e.g., a device driver, that provides an interface to system hardware 120. In addition, operating system 140 may include a file system 150 that manages files used in the operation of electronic device 100 and a process control subsystem 152 that manages processes executing on electronic device 100.

Operating system 140 may include (or manage) one or more communication interfaces that may operate in conjunction with system hardware 120 to transceive data packets and/or data streams from a remote source. Operating system 140 may further include a system call interface module 142 that provides an interface between the operating system 140 and one or more application modules resident in memory 130. Operating system 140 may be embodied as a UNIX operating system or any derivative thereof (e.g., Linux, Solaris, etc.) or as a Windows® brand operating system, or other operating systems.

In some embodiments memory 130 may store one or more applications which may execute on the one or more processors 122 including a state manage 162. These applications may be embodied as logic instructions stored in a tangible, non-transitory computer readable medium (i.e., software or firmware) which may be executable on one or more of the processors 122. Alternatively, these applications may be embodied as logic on a programmable device such as a field programmable gate array (FPGA) or the like. Alternatively, these applications may be reduced to logic that may be hardwired into an integrated circuit.

In some embodiments electronic device 100 may comprise a low-power embedded processor, referred to herein as a controller 170. The controller 170 may be implemented as an independent integrated circuit located on the motherboard of the system 100. In some embodiments the controller 170 may comprise one or more processors 172 and a memory module 174, and the state manager 162 may be implemented in the controller 170. By way of example, the memory module 174 may comprise a persistent flash memory module and the state manager 162 may be implemented as logic instructions encoded in the persistent memory module, e.g., firmware or software. Because the controller 170 is physically separate from the main processor(s) 122 and operating system 140, the adjunct controller 170 may be made secure, i.e., inaccessible to hackers such that it cannot be tampered with.

Figure 2:
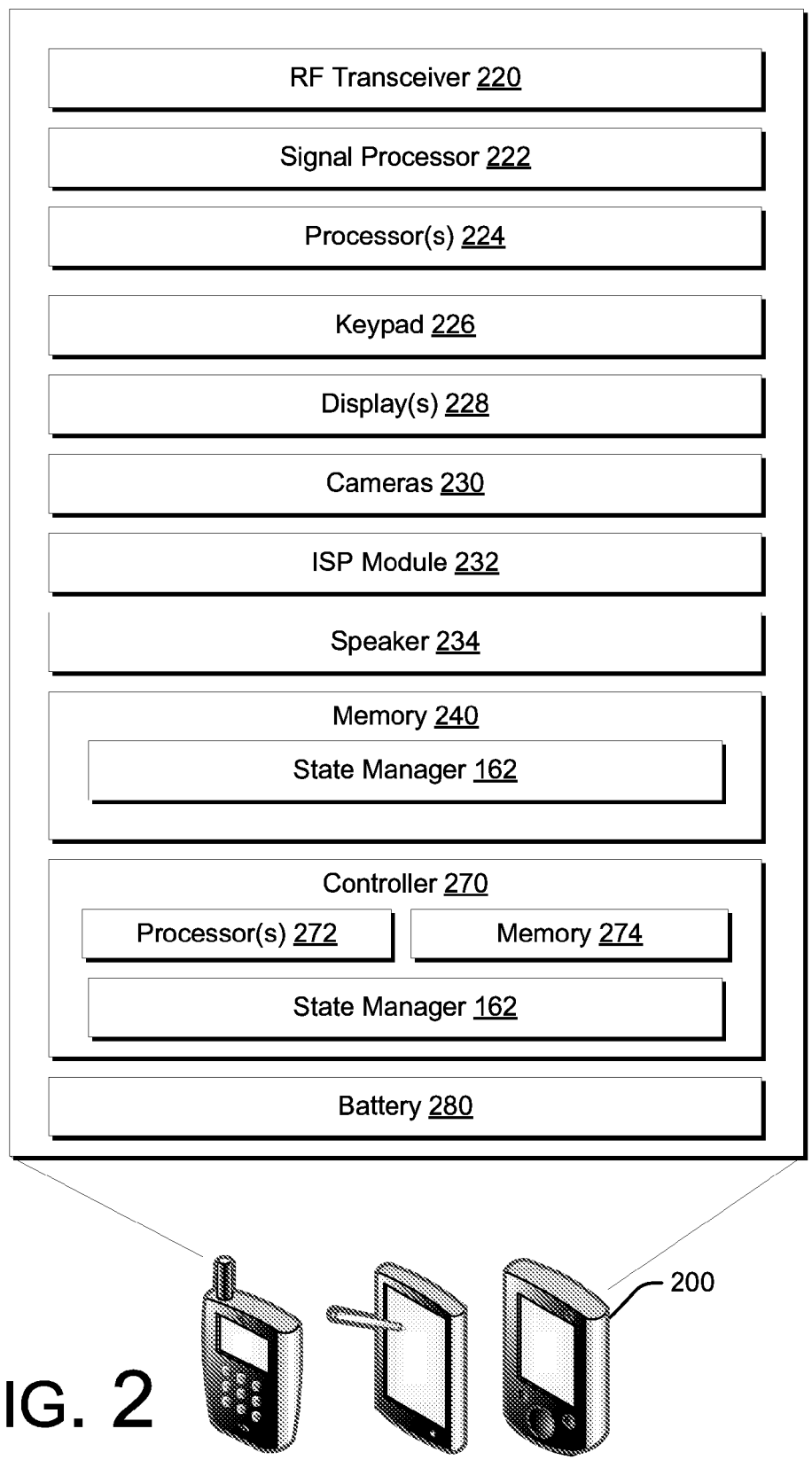

FIG. 2 is a schematic illustration of another embodiment of an electronic device 200 which may be adapted to which may be adapted to implement battery power management as described herein, according to embodiments. In some embodiments electronic device 200 may be embodied as a mobile telephone, a personal digital assistant (PDA), a laptop computer, or the like. Electronic device 200 may include one or more temperature sensors 212, an RF transceiver 220 to transceive RF signals and a signal processing module 222 to process signals received by RF transceiver 220.

RF transceiver 220 may implement a local wireless connection via a protocol such as, e.g., Bluetooth or 802.11x. IEEE 802.11a, b or g-compliant interface (see, e.g., IEEE Standard for IT-Telecommunications and information exchange between systems LAN/MAN—Part II: Wireless LAN Medium Access Control (MAC) and Physical Layer (PHY) specifications Amendment 4: Further Higher Data Rate Extension in the 2.4 GHz Band, 802.11G-2003). Another example of a wireless interface would be a general packet radio service (GPRS) interface (see, e.g., Guidelines on GPRS Handset Requirements, Global System for Mobile Communications/GSM Association, Ver. 3.0.1, December 2002).

Electronic device 200 may further include one or more processors 224 and a memory module 240. As used herein, the term "processor" means any type of computational element, such as but not limited to, a microprocessor, a microcontroller, a complex instruction set computing (CISC) microprocessor, a reduced instruction set (RISC) microprocessor, a very long instruction word (VLIW) microprocessor, or any other type of processor or processing circuit. In some embodiments, processor 224 may be one or more processors in the family of Intel® PXA27x processors available from Intel® Corporation of Santa Clara, Calif. Alternatively, other CPUs may be used, such as Intel's Itanium®, XEON™, ATOM™, and Celeron® processors. Also, one or more processors from other manufactures may be utilized. Moreover, the processors may have a single or multi core design.

In some embodiments, memory module 240 includes volatile memory (RAM); however, memory module 240 may be implemented using other memory types such as dynamic RAM (DRAM), synchronous DRAM (SDRAM), and the like. Memory 240 may store one or more applications which execute on the processor(s) 222.

Electronic device 200 may further include one or more input/output interfaces such as, e.g., a keypad 226 and one or more displays 228. In some embodiments electronic device 200 comprises one or more camera modules 220 and an image signal processor 232, and speakers 234. A power source such as a battery 270 may be coupled to electronic device 200.

In some embodiments electronic device 200 may include a controller 270 which may be implemented in a manner analogous to that of adjunct controller 170, described above. In the embodiment depicted in FIG. 2 the controller 270 comprises one or more processor(s) 272 and a memory module 274, which may be implemented as a persistent flash memory module. Because the controller 270 is physically separate from the main processor(s) 224, the controller 270 may be made secure, i.e., inaccessible to hackers such that it cannot be tampered with.

In some embodiments at least one of the memory 230 or the controller 270 may comprise a state manager 162, which may be implemented as logic instructions encoded in the persistent memory module, e.g., firmware or software.

Figure 3:
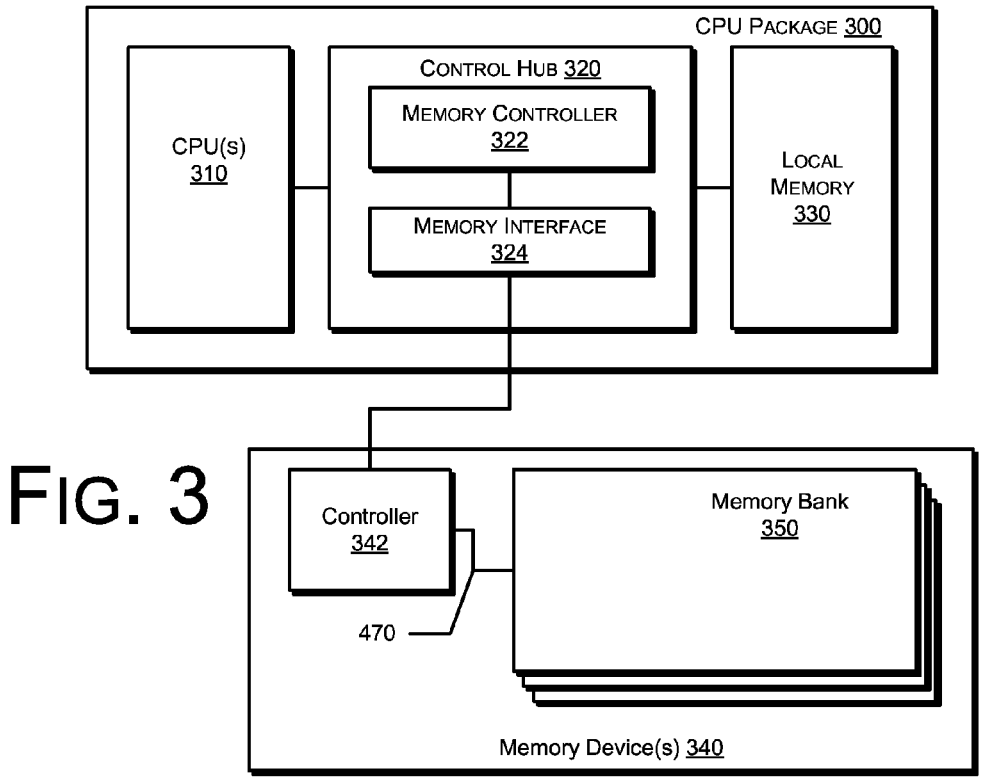
FIGS. 3 and 4 are schematic, block diagram illustration of components of a memory system which may implement memory state management in accordance with various embodiments discussed herein.

FIG. 3 is a schematic, block diagram illustration of components of apparatus to implement memory latency management in accordance with various embodiments discussed herein. Referring to FIG. 3, in some embodiments a central processing unit (CPU) package 300 which may comprise one or more CPUs 310 coupled to a control hub 320 and a local memory 330. Control hub 320 comprises a memory controller 322 and a memory interface 324.

Memory interface 324 is coupled to one or more remote memory devices 340 by a communication bus 360. Memory device 340 may comprise a controller 342 and one or more memory banks 350. In various embodiments, memory banks 350 may be implemented using nonvolatile memory. By way of example, in some embodiments the memory device(s) 340 may comprise any suitable non-volatile memory, including but not limited to NAND (flash) memory, ferroelectric random-access memory (FeTRAM), nanowire-based non-volatile memory, memory that incorporates memristor technology, MRAM, STT-MRAM, three dimensional (3D) cross point resistive memory such as phase change memory (PCM). The specific configuration of the memory bank(s) 350 in the memory device(s) 340 is not critical.

Figure 4:
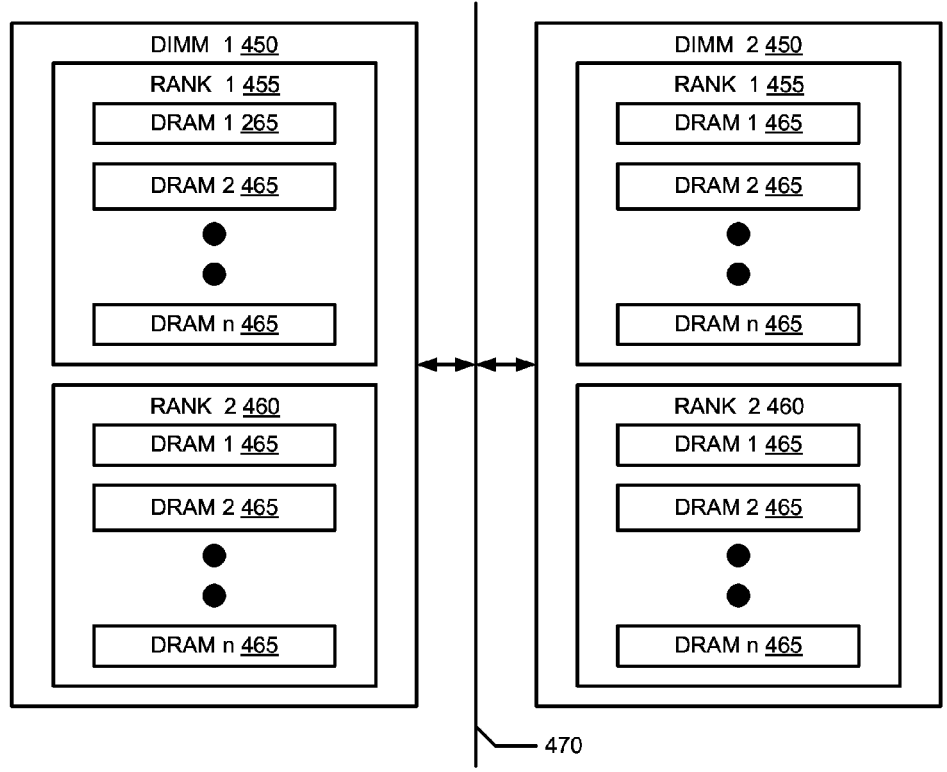

In various embodiments, memory 330 may be implemented using volatile memory such as one or more DRAM memory modules. FIG. 4 is a schematic, block diagram of an exemplary 330 which may be adapted to implement memory state management in accordance with various embodiments discussed herein. Referring to FIG. 4, in some embodiments the memory 330 may comprise one or more direct in-line memory modules (DIMMs) 450 coupled to a memory channel 470 which provides a communication link to memory controller 322. In the embodiment depicted in FIG. 4 each DIMM comprises a first rank 455 and a second rank 460, each of which includes a plurality of DRAM modules 465. One skilled in the art will recognize that memory 330 may comprise more or fewer DIMMs 450, and more or fewer ranks per DIMM. Further, some electronic devices (e.g., smart phones, tablet computers, and the like) may comprise simpler memory systems comprised of one or more DRAMs which need not be organized into DIMMs.

Having described various embodiments and configurations of electronic devices which may be adapted to implement memory state management, attention will now be turned to methods to implement memory state management. In some embodiments the state manager 162 may comprise logic which, when executed, implements memory state management in a memory system of an electronic device. Operations of the state manager 162 will be described with reference to FIG. 5.

Figure 5:
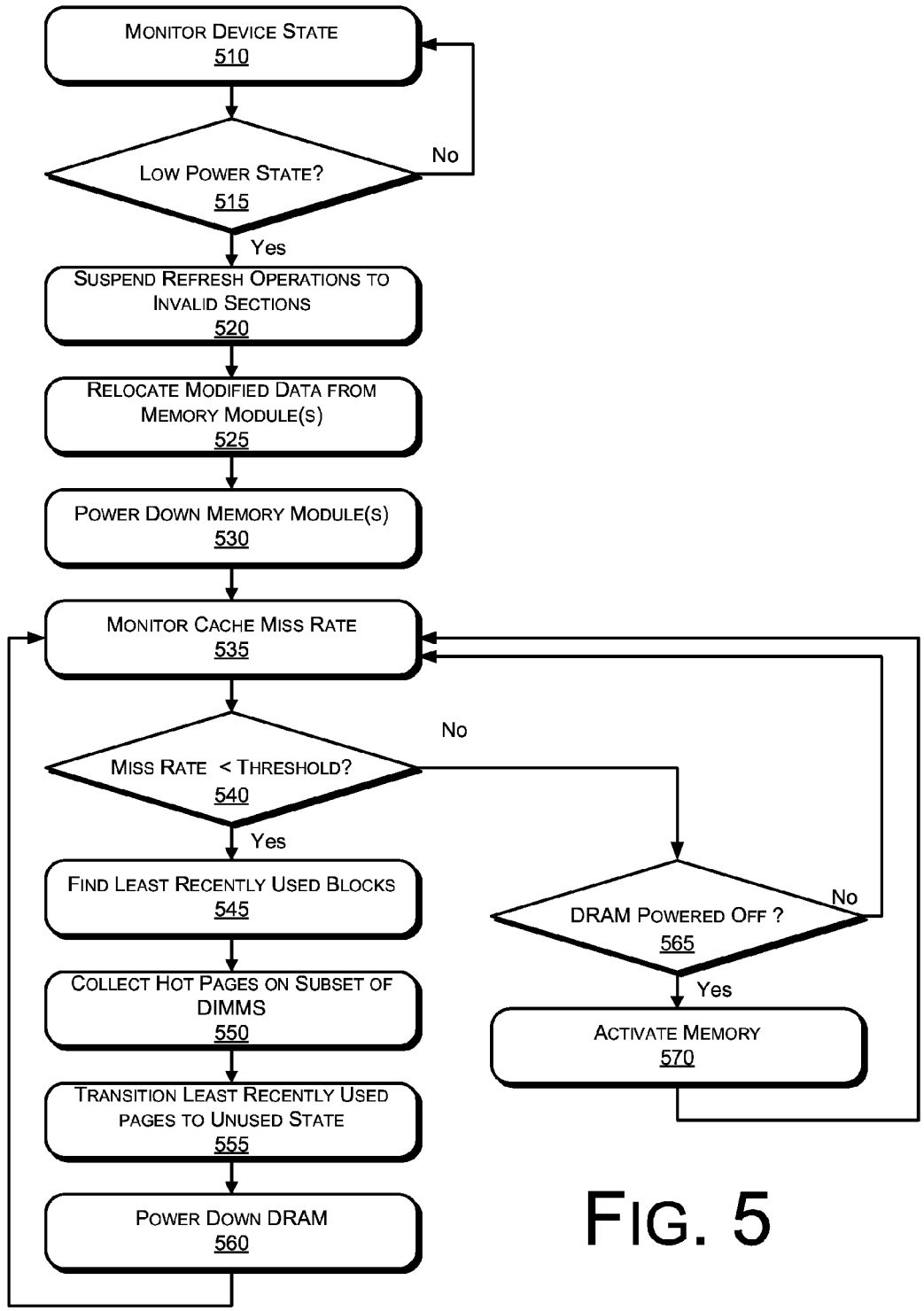
FIG. 5 is a flowchart illustrating operations in a method for battery power management in accordance with some embodiments.

Referring to FIG. 5, at operation 510 the state manager 162 monitors the device state. Many computer systems and their respective components may operate in one of a plurality of power states. By way of example, the Advanced Configuration and Power Interface (ACPI) specification defines a plurality of active states and a plurality of inactive, or sleep, states for electronic devices. Each state is associated with particular operating states for various components and thereby defines different power consumption states. Sleep states are numbered S1-S4 states. Higher numbers correlate to deeper sleep states and correspondingly lower power consumption. By way of example, the state manager 162 may periodically check the sleep state from the ACPI register maintained by the basic input/output system (BIOS) of the electronic device.

If, at operation 515, the electronic device is not in a low power (i.e., sleep) state then control passes back to operation 510 and normal memory operations are allowed to continue. By contrast, if at operation 515 the device is in a low power state then the state manager 162 implements a memory state management routine which reduces power to at least a section of volatile memory in the memory 330. In some embodiments the state manager 162 may require the electronic device to be in a specified sleep state (e.g., S3) or higher in order to invoke a memory state management routine.

At operation 520 the state manager 162 suspends refresh operations to sections of the volatile memory in memory 330. By way of example, in some embodiments the state manager 162 may scan one or more memory management tables associated with the volatile memory in memory 330 and may identify one or more sections (e.g., cache lines, pages, or entire DRAMS) which are in an I state. The state manager 162 may then instruct the memory controller 322 to skip refresh operations on some or all of the memory sections identified as being in the I state.

At operation 525 the state manager 162 may relocate data from one or more sections of the volatile memory in memory 330. By way of example, in some embodiments the state manager 162 may scan one or more memory management tables associated with the volatile memory in volatile memory 330 and may identify one or more sections (e.g., cache lines, pages, or entire DRAMS) which are in an M state. The state manager 162 may then instruct the memory controller 322 to relocate the data, e.g., by writing the data back to nonvolatile memory in volatile memory device(s) 340. In some examples this may be performed at the DRAM level so that all data from sections in an M state on a DRAM is written back to the nonvolatile memory in volatile memory device(s) 340. The state manager may then cut power (operation 530) to the DRAM chip, taking the DRAM chip offline.

When the memory system is operating in a state with reduced volatile memory capacity the state manager 162 may implement a routine which adjusts the amount of active nonvolatile memory dynamically in response to changes in the cache miss rate to achieve a balance between performance requirements and power conservation. Thus, at operation 535 the state manager 162 monitors the cache miss rate of the memory 330.

If at operation 540 the cache miss rate is less than a threshold value then the state manager 162 will attempt to take more volatile memory offline to conserve power. Control thus passes to operation 545 and the state manager 162 may locate the least recently used (LRU) blocks of volatile memory in memory 330. At operation 550 the state manager 162 collects active pages of memory onto a subset of DIMMs in the volatile memory 330. At operation 555 the state manager 162 transitions the least recently used pages to an unused (U) state, and at operation 560 the state manager 162 powers down the DRAM chip. Control can then pass back to operation 535 and state manager 162 continues to monitor the cache miss rate.

If, at operation 540 the cache miss rate is not less than a threshold value, then control passes to operation 565. If, at operation 565 there are no DRAMs powered off then control passes back to operation 535 and the state manager 162 continues to monitor the cache miss rate. By contrast, if at operation 570 one or more DRAMs are powered off then control passes to operation 570 and the state manager 162 activates a portion of the volatile memory to increase the amount of volatile memory available in memory 330. To activate the volatile memory the state manager 162 may identify regions of memory to bring back online and may set the memory back into a self-refresh mode. The cache state for the memory may then be transitioned from the unused (U) state to the invalid (I) state.

Thus, operations 535-570 define a loop by which the state manager 162 can dynamically adjust the amount of volatile memory available in memory 330 to strike a balance between memory performance and power consumption when the memory 330 is operating in a reduced capacity. In some embodiments the state manager may utilize information from page tables for memory 330 to facilitate operations. For example, pages that are mapped as read-only, such as executable pages, can be placed in an area of contiguous memory such that the state manager 162 does not have to look for modified lines (M state). Rather, it can transition directly from state X to state U with no write back operations required. This saves power since no volatile memory writes will be required. The operating system memory manager may also be arranged such that read-only pages are located contiguously.

Figure 6:
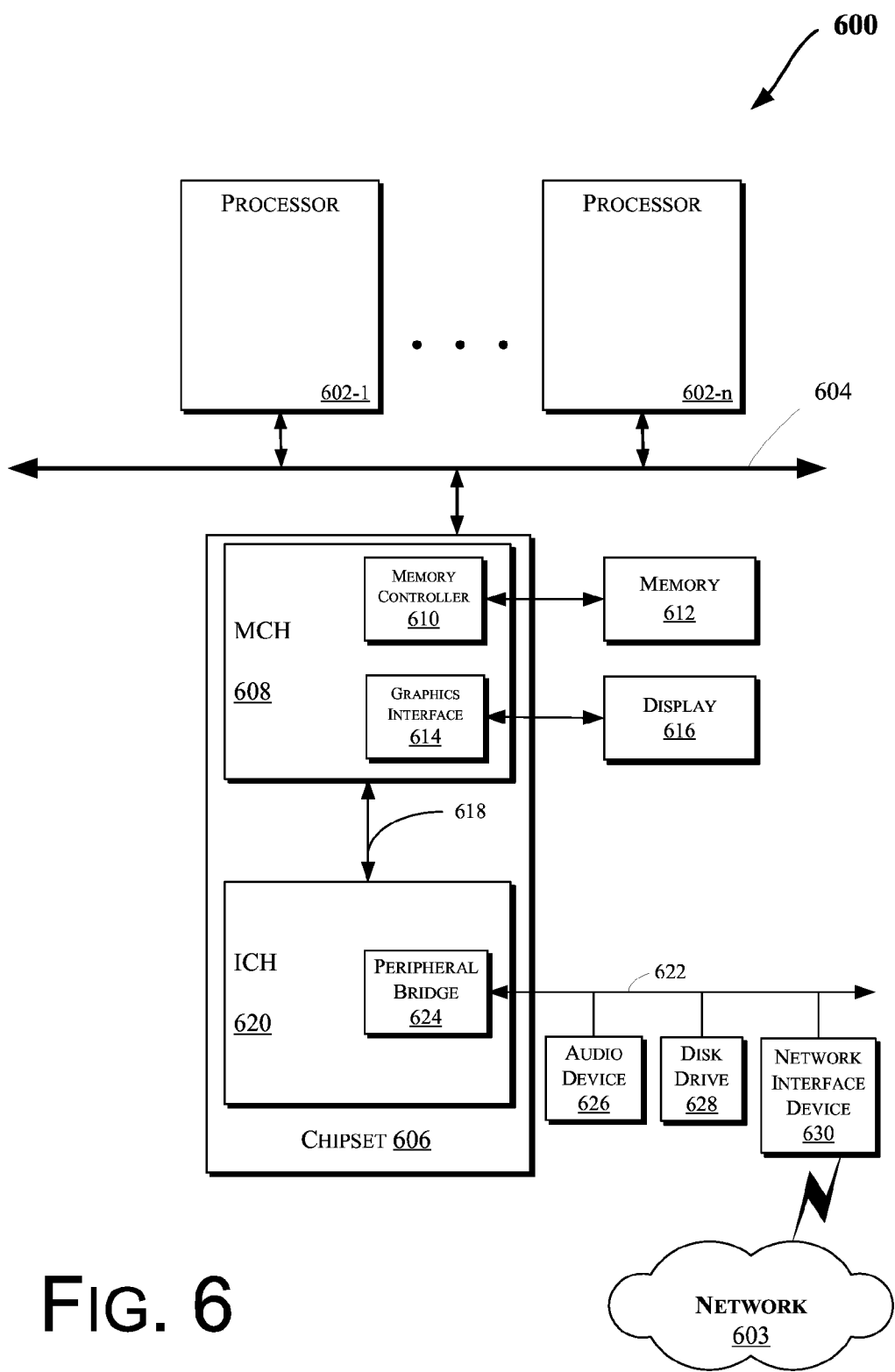
FIGS. 6-9 are schematic illustrations of electronic devices which may be modified to implement battery power management in accordance with some embodiments.

As described above, in some embodiments the electronic device may be embodied as a computer system. FIG. 6 illustrates a block diagram of a computing system 600 in accordance with an embodiment of the invention. The computing system 600 may include one or more central processing unit(s) (CPUs) 602 or processors that communicate via an interconnection network (or bus) 604. The processors 602 may include a general purpose processor, a network processor (that processes data communicated over a computer network 603), or other types of a processor (including a reduced instruction set computer (RISC) processor or a complex instruction set computer (CISC)). Moreover, the processors 602 may have a single or multiple core design. The processors 602 with a multiple core design may integrate different types of processor cores on the same integrated circuit (IC) die. Also, the processors 602 with a multiple core design may be implemented as symmetrical or asymmetrical multiprocessors. In an embodiment, one or more of the processors 602 may be the same or similar to the processors 102 of FIG. 1. For example, one or more of the processors 602 may implement the state manager discussed with reference to FIGS. 1-2. Also, the operations discussed with reference to FIG. 5 may be performed by one or more components of the system 600.

A chipset 606 may also communicate with the interconnection network 604. The chipset 606 may include a memory control hub (MCH) 608. The MCH 608 may include a memory controller 610 that communicates with a memory 612 (which may be the same or similar to the memory 130 of FIG. 1). The memory 412 may store data, including sequences of instructions, that may be executed by the CPU 602, or any other device included in the computing system 600. In one embodiment of the invention, the memory 612 may include one or more volatile storage (or memory) devices such as random access memory (RAM), dynamic RAM (DRAM), synchronous DRAM (SDRAM), static RAM (SRAM), or other types of storage devices. Additional devices may communicate via the interconnection network 604, such as multiple CPUs and/or multiple system memories.

The MCH 608 may also include a graphics interface 614 that communicates with a display device 616. In one embodiment of the invention, the graphics interface 614 may communicate with the display device 616 via an accelerated graphics port (AGP). In an embodiment of the invention, the display 616 (such as a flat panel display) may communicate with the graphics interface 614 through, for example, a signal converter that translates a digital representation of an image stored in a storage device such as video memory or system memory into display signals that are interpreted and displayed by the display 616. The display signals produced by the display device may pass through various control devices before being interpreted by and subsequently displayed on the display 616.

A hub interface 618 may allow the MCH 608 and an input/output control hub (ICH) 620 to communicate. The ICH 620 may provide an interface to I/O device(s) that communicate with the computing system 600. The ICH 620 may communicate with a bus 622 through a peripheral bridge (or controller) 624, such as a peripheral component interconnect (PCI) bridge, a universal serial bus (USB) controller, or other types of peripheral bridges or controllers. The bridge 624 may provide a data path between the CPU 602 and peripheral devices. Other types of topologies may be utilized. Also, multiple buses may communicate with the ICH 620, e.g., through multiple bridges or controllers. Moreover, other peripherals in communication with the ICH 620 may include, in various embodiments of the invention, integrated drive electronics (IDE) or small computer system interface (SCSI) hard drive(s), USB port(s), a keyboard, a mouse, parallel port(s), serial port(s), floppy disk drive(s), digital output support (e.g., digital video interface (DVI)), a solid state drive (SSD) with SATA interface or PCIe interface, or other devices.

The bus 622 may communicate with an audio device 626, one or more disk drive(s) 628, and a network interface device 630 (which is in communication with the computer network 603). Other devices may communicate via the bus 622. Also, various components (such as the network interface device 630) may communicate with the MCH 608 in some embodiments of the invention. In addition, the processor 602 and one or more other components discussed herein may be combined to form a single chip (e.g., to provide a System on Chip (SOC)). Furthermore, the graphics accelerator 616 may be included within the MCH 608 in other embodiments of the invention.

Furthermore, the computing system 600 may include volatile and/or nonvolatile memory (or storage). For example, nonvolatile memory may include one or more of the following: read-only memory (ROM), programmable ROM (PROM), erasable PROM (EPROM), electrically EPROM (EEPROM), a disk drive (e.g., 628), a floppy disk, a compact disk ROM (CD-ROM), a digital versatile disk (DVD), flash memory, a magneto-optical disk, or other types of nonvolatile machine-readable media that are capable of storing electronic data (e.g., including instructions).

Figure 7:
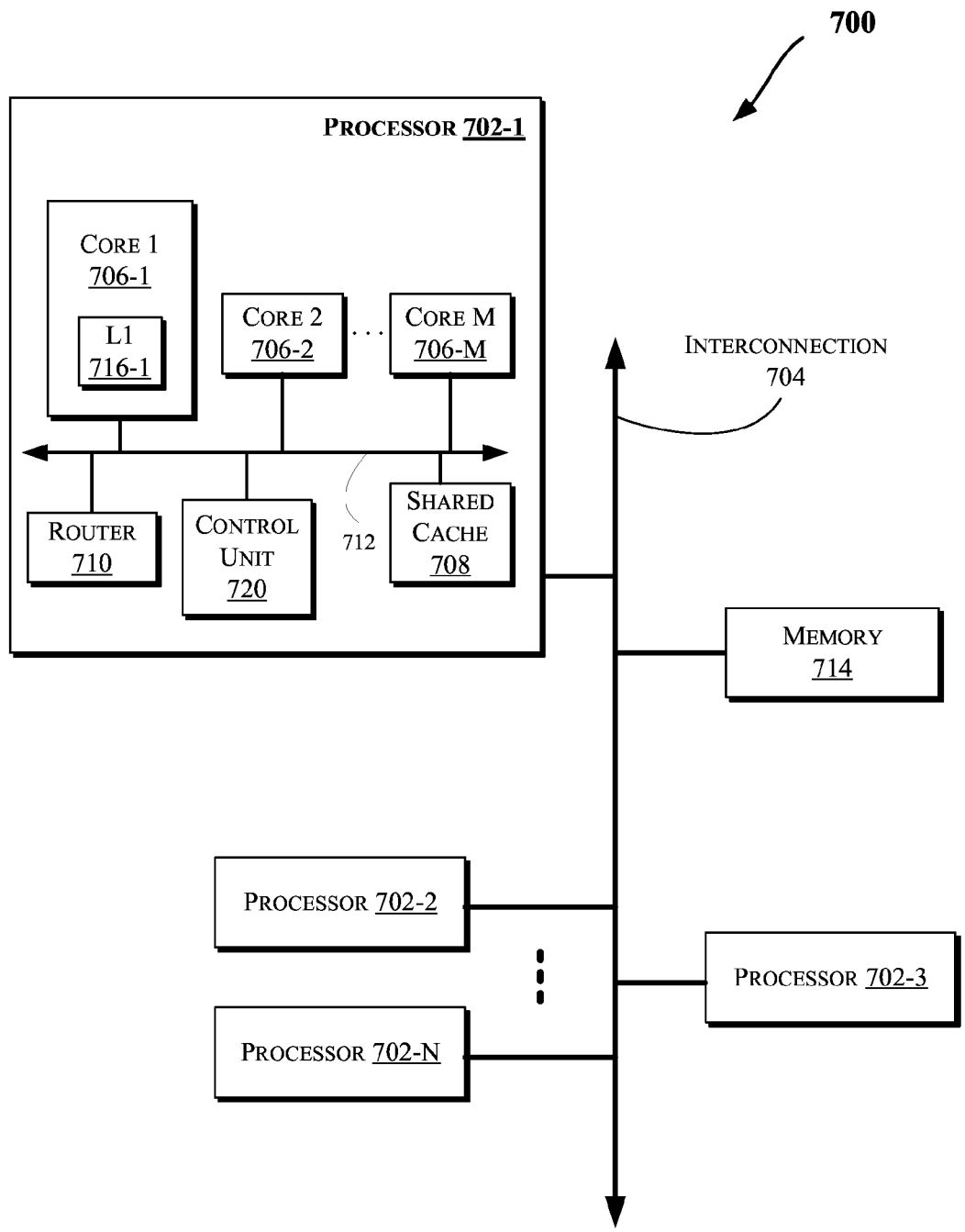

FIG. 7 illustrates a block diagram of a computing system 700, according to an embodiment of the invention. The system 700 may include one or more processors 702-1 through 702-N (generally referred to herein as "processors 702" or "processor 702"). The processors 702 may communicate via an interconnection network or bus 704. Each processor may include various components some of which are only discussed with reference to processor 702-1 for clarity. Accordingly, each of the remaining processors 702-2 through 702-N may include the same or similar components discussed with reference to the processor 702-1.

In an embodiment, the processor 702-1 may include one or more processor cores 706-1 through 706-M (referred to herein as "cores 706" or more generally as "core 706"), a shared cache 708, a router 710, and/or a processor control logic or unit 720. The processor cores 706 may be implemented on a single integrated circuit (IC) chip. Moreover, the chip may include one or more shared and/or private caches (such as cache 708), buses or interconnections (such as a bus or interconnection network 712), memory controllers, or other components.

In one embodiment, the router 710 may be used to communicate between various components of the processor 702-1 and/or system 700. Moreover, the processor 702-1 may include more than one router 710. Furthermore, the multitude of routers 710 may be in communication to enable data routing between various components inside or outside of the processor 702-1.

The shared cache 708 may store data (e.g., including instructions) that are utilized by one or more components of the processor 702-1, such as the cores 706. For example, the shared cache 708 may locally cache data stored in a memory 714 for faster access by components of the processor 702. In an embodiment, the cache 708 may include a mid-level cache (such as a level 2 (L2), a level 3 (L3), a level 4 (L4), or other levels of cache), a last level cache (LLC), and/or combinations thereof. Moreover, various components of the processor 702-1 may communicate with the shared cache 708 directly, through a bus (e.g., the bus 712), and/or a memory controller or hub. As shown in FIG. 7, in some embodiments, one or more of the cores 706 may include a level 1 (L1) cache 716-1 (generally referred to herein as "L1 cache 716"). In one embodiment, the controller 720 may include logic to implement the operations described above with reference to FIG. 3.

Figure 8:
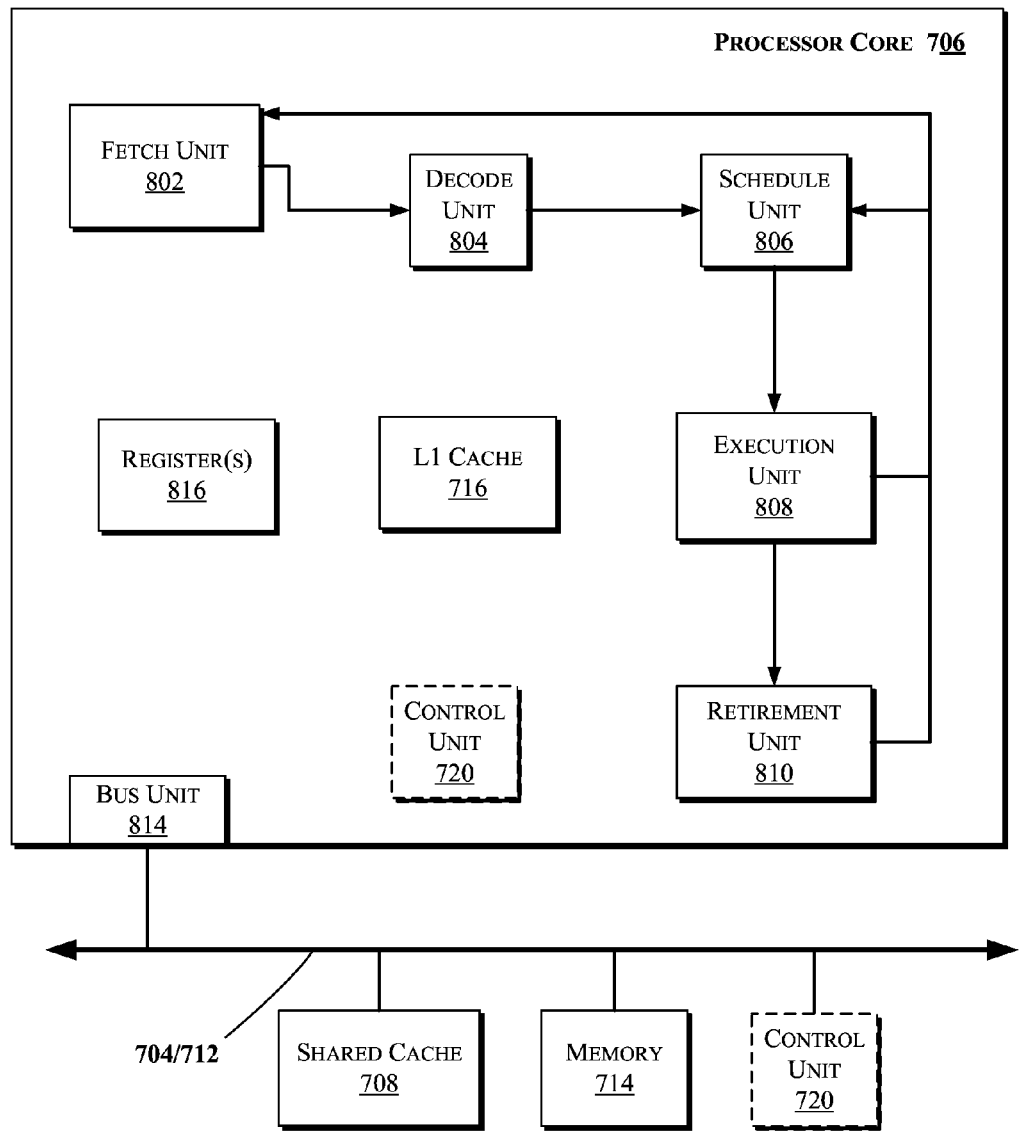

FIG. 8 illustrates a block diagram of portions of a processor core 706 and other components of a computing system, according to an embodiment of the invention. In one embodiment, the arrows shown in FIG. 8 illustrate the flow direction of instructions through the core 706. One or more processor cores (such as the processor core 706) may be implemented on a single integrated circuit chip (or die) such as discussed with reference to FIG. 7. Moreover, the chip may include one or more shared and/or private caches (e.g., cache 708 of FIG. 7), interconnections (e.g., interconnections 704 and/or 112 of FIG. 7), control units, memory controllers, or other components.

As illustrated in FIG. 8, the processor core 706 may include a fetch unit 802 to fetch instructions (including instructions with conditional branches) for execution by the core 706. The instructions may be fetched from any storage devices such as the memory 714. The core 706 may also include a decode unit 804 to decode the fetched instruction. For instance, the decode unit 804 may decode the fetched instruction into a plurality of uops (micro-operations).

Additionally, the core 706 may include a schedule unit 806. The schedule unit 806 may perform various operations associated with storing decoded instructions (e.g., received from the decode unit 804) until the instructions are ready for dispatch, e.g., until all source values of a decoded instruction become available. In one embodiment, the schedule unit 806 may schedule and/or issue (or dispatch) decoded instructions to an execution unit 808 for execution. The execution unit 808 may execute the dispatched instructions after they are decoded (e.g., by the decode unit 804) and dispatched (e.g., by the schedule unit 806). In an embodiment, the execution unit 808 may include more than one execution unit. The execution unit 808 may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit 808.

Further, the execution unit 808 may execute instructions out-of-order. Hence, the processor core 706 may be an out-of-order processor core in one embodiment. The core 706 may also include a retirement unit 810. The retirement unit 810 may retire executed instructions after they are committed. In an embodiment, retirement of the executed instructions may result in processor state being committed from the execution of the instructions, physical registers used by the instructions being de-allocated, etc.

The core 706 may also include a bus unit 714 to enable communication between components of the processor core 706 and other components (such as the components discussed with reference to FIG. 8) via one or more buses (e.g., buses 804 and/or 812). The core 706 may also include one or more registers 816 to store data accessed by various components of the core 706 (such as values related to power consumption state settings).

Furthermore, even though FIG. 7 illustrates the control unit 720 to be coupled to the core 706 via interconnect 812, in various embodiments the control unit 720 may be located elsewhere such as inside the core 706, coupled to the core via bus 704, etc.

Figure 9:
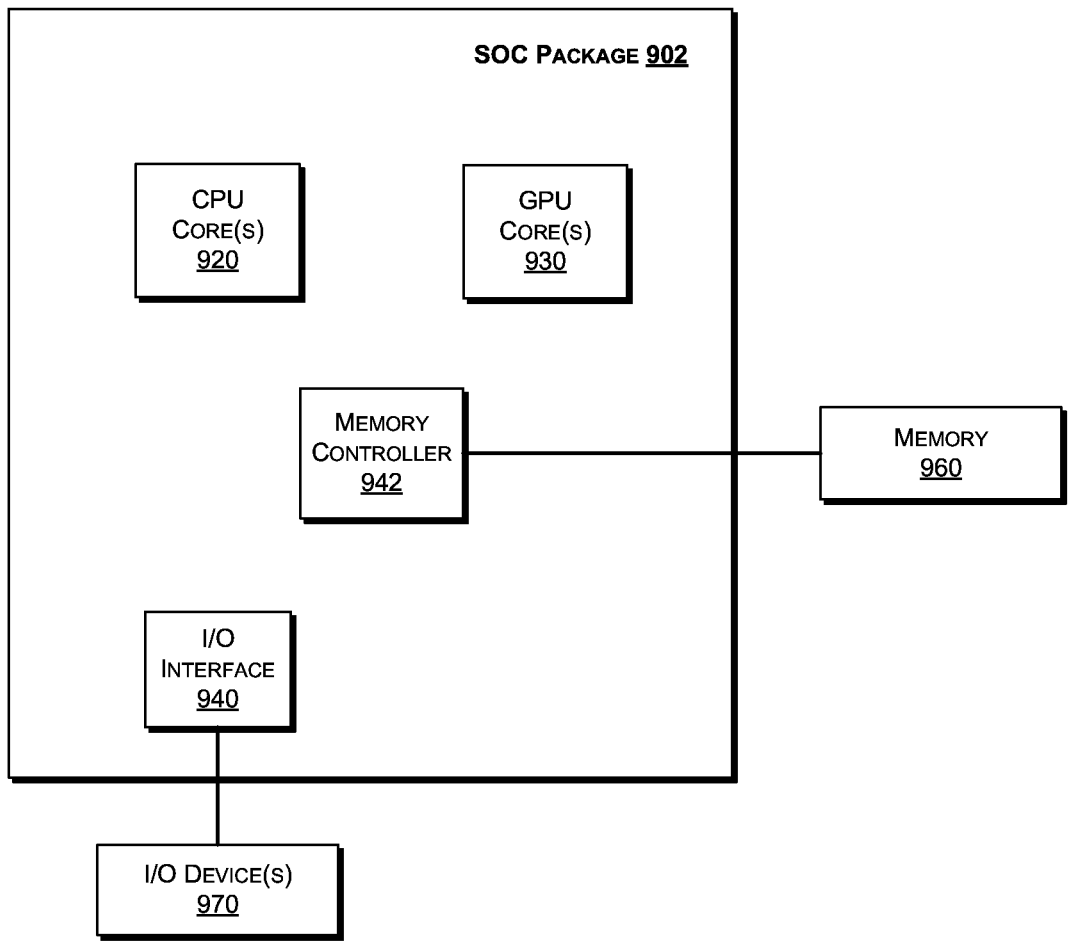

In some embodiments, one or more of the components discussed herein can be embodied as a System On Chip (SOC) device. FIG. 9 illustrates a block diagram of an SOC package in accordance with an embodiment. As illustrated in FIG. 9, SOC 902 includes one or more Central Processing Unit (CPU) cores 920, one or more Graphics Processor Unit (GPU) cores 930, an Input/Output (I/O) interface 940, and a memory controller 942. Various components of the SOC package 902 may be coupled to an interconnect or bus such as discussed herein with reference to the other figures. Also, the SOC package 902 may include more or less components, such as those discussed herein with reference to the other figures. Further, each component of the SOC package 902 may include one or more other components, e.g., as discussed with reference to the other figures herein. In one embodiment, SOC package 902 (and its components) is provided on one or more Integrated Circuit (IC) die, e.g., which are packaged into a single semiconductor device.

As illustrated in FIG. 9, SOC package 902 is coupled to a memory 960 (which may be similar to or the same as memory discussed herein with reference to the other figures) via the memory controller 942. In an embodiment, the memory 960 (or a portion of it) can be integrated on the SOC package 902.

The I/O interface 940 may be coupled to one or more I/O devices 970, e.g., via an interconnect and/or bus such as discussed herein with reference to other figures. I/O device(s) 970 may include one or more of a keyboard, a mouse, a touchpad, a display, an image/video capture device (such as a camera or camcorder/video recorder), a touch screen, a speaker, or the like.

The following examples pertain to further embodiments.

Example 1 is a computer program product comprising logic instructions stored in a non-transitory computer readable medium which, when executed by a controller, configure the controller to perform operations to manage a memory state of a volatile memory, comprising determining whether an electronic device comprising a volatile memory and a nonvolatile memory is operating in a low power state, and in response to a determination that the electronic device is operating in a low power state, implementing a memory state management routine which reduces power to at least a section of the volatile memory in the memory system.

The computer program product may further comprising logic instructions stored in the non-transitory computer readable medium which, when executed by the controller, configure the controller to perform operations comprising identifying one or more sections of volatile memory which are in an invalid state and suspending refresh operations to the one or more sections of volatile memory in an invalid state.

The computer program product may further comprise logic instructions stored in the non-transitory computer readable medium which, when executed by the controller, configure the controller to perform operations comprising identifying one or more sections of a volatile memory module which are in a modified state, relocating data from the one or more sections of a volatile memory module which are in a modified state, and powering down the volatile memory module.

The computer program product may further comprise logic instructions stored in the non-transitory computer readable medium which, when executed by the controller, configure the controller to perform operations comprising determining whether a cache miss rate is below a threshold and in response to a determination that the cache miss rate is below the threshold identifying one or more least recently used sections of a volatile memory module which are in a modified state relocating data from the one or more least recently used sections of the volatile memory module which are in a modified state and powering down the volatile memory module.

The computer program product may further comprise logic instructions stored in the non-transitory computer readable medium which, when executed by the controller, configure the controller to perform operations comprising determining whether a cache miss rate is below a threshold and in response to a determination that the cache miss rate is not below the threshold activating at least one inactive memory module.

The sections of volatile memory correspond to at least one of a cache line, a memory chip, a memory rank, or a memory bank.

In example 2, a controller comprises logic to determine whether an electronic device comprising a volatile memory and a nonvolatile memory is operating in a low power state and in response to a determination that the electronic device is operating in a low power state, implement a memory state management routine which reduces power to at least a section of the volatile memory in the memory system.

The controller may comprise logic to identify one or more sections of volatile memory which are in an invalid state and suspend refresh operations to the one or more sections of volatile memory in an invalid state.

The controller may comprise logic to identify one or more sections of a volatile memory module which are in a modified state relocate data from the one or more sections of a volatile memory module which are in a modified state, and power down the volatile memory module.

The controller may comprise logic to determine whether a cache miss rate is below a threshold, and in response to a determination that the cache miss rate is below the threshold, to identify one or more least recently used sections of a volatile memory module which are in a modified state, relocate data from the one or more least recently used sections of the volatile memory module which are in a modified state, and power down the volatile memory module.

The controller may comprise logic to determine whether a cache miss rate is below a threshold, and in response to a determination that the cache miss rate is not below the threshold, to activate at least one inactive memory module.

The sections of volatile memory correspond to at least one of a cache line, a memory chip, a memory rank, or a memory bank.

In example 3, an electronic device, comprises a memory system and a controller comprising logic to determine whether an electronic device is operating in a low power state, and in response to a determination that the electronic device is operating in a low power state, implement a memory state management routine which reduces power to at least a section of volatile memory in the memory system.

The electronic device may comprise logic to identify one or more sections of volatile memory which are in an invalid state, and suspend refresh operations to the one or more sections of volatile memory in an invalid state.

The electronic device may comprise logic to identify one or more sections of a volatile memory module which are in a modified state, relocate data from the one or more sections of a volatile memory module which are in a modified state, and power down the volatile memory module.

The electronic device may comprise logic to determine whether a cache miss rate is below a threshold, and in response to a determination that the cache miss rate is below the threshold. to identify one or more least recently used sections of a volatile memory module which are in a modified state, relocate data from the one or more least recently used sections of the volatile memory module which are in a modified state, and power down the volatile memory module.

The electronic device may comprise logic to determine whether a cache miss rate is below a threshold, and in response to a determination that the cache miss rate is not below the threshold, to activate at least one inactive memory module.

The sections of volatile memory correspond to at least one of a cache line, a memory chip, a memory rank, or a memory bank.

In example 4, a method to manage a memory system coupled to an electronic device, wherein the memory system comprises a volatile memory and a nonvolatile memory, comprises determining, in a controller, whether an electronic device is operating in a low power state, and in response to a determination that the electronic device is operating in a low power state, implementing a memory state management routine which reduces power to at least a section of volatile memory in the memory system.

The method may further comprise identifying one or more sections of volatile memory which are in an invalid state, and suspending refresh operations to the one or more sections of volatile memory in an invalid state.

The method may further comprise identifying one or more sections of a volatile memory module which are in a modified state, relocating data from the one or more sections of a volatile memory module which are in a modified state, and powering down the volatile memory module.

The method may further comprise determining whether a cache miss rate is below a threshold, and in response to a determination that the cache miss rate is below the threshold, identifying one or more least recently used sections of a volatile memory module which are in a modified state, relocating data from the one or more least recently used sections of the volatile memory module which are in a modified state, and powering down the volatile memory module.

The method may further comprise determining whether a cache miss rate is below a threshold, and in response to a determination that the cache miss rate is not below the threshold, activating at least one inactive memory module.

The sections of volatile memory correspond to at least one of a cache line, a memory chip, a memory rank, or a memory bank.

The terms "logic instructions" as referred to herein relates to expressions which may be understood by one or more machines for performing one or more logical operations. For example, logic instructions may comprise instructions which are interpretable by a processor compiler for executing one or more operations on one or more data objects. However, this is merely an example of machine-readable instructions and embodiments are not limited in this respect.

The terms "computer readable medium" as referred to herein relates to media capable of maintaining expressions which are perceivable by one or more machines. For example, a computer readable medium may comprise one or more storage devices for storing computer readable instructions or data. Such storage devices may comprise storage media such as, for example, optical, magnetic or semiconductor storage media. However, this is merely an example of a computer readable medium and embodiments are not limited in this respect.

The term "logic" as referred to herein relates to structure for performing one or more logical operations. For example, logic may comprise circuitry which provides one or more output signals based upon one or more input signals. Such circuitry may comprise a finite state machine which receives a digital input and provides a digital output, or circuitry which provides one or more analog output signals in response to one or more analog input signals. Such circuitry may be provided in an application specific integrated circuit (ASIC) or field programmable gate array (FPGA). Also, logic may comprise machine-readable instructions stored in a memory in combination with processing circuitry to execute such machine-readable instructions. However, these are merely examples of structures which may provide logic and embodiments are not limited in this respect.

Some of the methods described herein may be embodied as logic instructions on a computer-readable medium. When executed on a processor, the logic instructions cause a processor to be programmed as a special-purpose machine that implements the described methods. The processor, when configured by the logic instructions to execute the methods described herein, constitutes structure for performing the described methods. Alternatively, the methods described herein may be reduced to logic on, e.g., a field programmable gate array (FPGA), an application specific integrated circuit (ASIC) or the like.

In the description and claims, the terms coupled and connected, along with their derivatives, may be used. In particular embodiments, connected may be used to indicate that two or more elements are in direct physical or electrical contact with each other. Coupled may mean that two or more elements are in direct physical or electrical contact. However, coupled may also mean that two or more elements may not be in direct contact with each other, but yet may still cooperate or interact with each other.

Reference in the specification to "one embodiment" or "some embodiments" means that a particular feature, structure, or characteristic described in connection with the embodiment is included in at least an implementation. The appearances of the phrase "in one embodiment" in various places in the specification may or may not be all referring to the same embodiment.

Although embodiments have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:

1. A computer program product comprising logic instructions stored in a non-transitory computer readable medium which, when executed by a controller, configure the controller to perform operations to manage a memory state of a volatile memory comprising a plurality of direct in-line memory modules (DIMMS), comprising:
    determining whether an electronic device comprising a volatile memory and a nonvolatile memory is operating in a low power state; and
    in response to a determination that the electronic device is operating in the low power state, determining whether a cache miss rate is below a threshold; and
    in response to a determination that the cache miss rate is below the threshold:
        identifying one or more least recently used sections of the volatile memory which are in a modified state;
        relocating data only from the one or more least recently used sections of a first DIMIM of the volatile memory which are in the modified state to a subset of DIMMs in the volatile memory; and
        powering down the first DIMM of the volatile memory.

2. The computer program product of claim 1, further comprising logic instructions stored in the non-transitory computer readable medium which, when executed by the controller, configure the controller to perform operations comprising:
    identifying one or more sections of the volatile memory which are in an invalid state; and
    suspending refresh operations to the one or more sections of the volatile memory in an the invalid state.

3. The computer program product of claim 1, further comprising logic instructions stored in the non-transitory computer readable medium which, when executed by the controller, configure the controller to perform operations comprising:
    identifying one or more sections of the volatile memory which are in a modified state;
    relocating data from the one or more sections of the volatile memory which are in the modified state; and
    powering down the one or more sections of the volatile memory.

4. The computer program product of claim 1, further comprising logic instructions stored in the non-transitory computer readable medium which, when executed by the controller, configure the controller to perform operations comprising:
    in response to the determination that the cache miss rate is not below the threshold:
        activating at least one inactive DIMM of the volatile memory.

5. The computer program product of claim 1, wherein the sections of volatile memory correspond to at least one of a cache line, a memory chip, a memory rank, or a memory bank.

6. The computer program product of claim 1, further comprising logic instructions stored in the non-transitory computer readable medium which, when executed by the controller, configure the controller to perform operations comprising:
arranging the volatile memory such that read-only pages are located contiguously.

7. A controller comprising logic to:
determine whether an electronic device comprising a volatile memory and a nonvolatile memory comprising a plurality of direct in-line memory modules (DIMMS) is operating in a low power state; and
in response to a determination that the electronic device is operating in the low power state, determine whether a cache miss rate is below a threshold; and
in response to a determination that the cache miss rate is below the threshold:
identify one or more least recently used sections of the volatile memory which are in a modified state;
relocate data only from the one or more least recently used sections of a first DIMIM of the volatile memory which are in the modified state to a subset of DIMMs in the volatile memory; and
power down the first DIMM of the volatile memory.

8. The controller of claim 7, comprising logic to:
identify one or more sections of volatile memory which are in an invalid state; and
suspend refresh operations to the one or more sections of volatile memory in the invalid state.

9. The controller of claim 7, further comprising logic to:
in response to a determination that the cache miss rate is not below the threshold:
activate at least one inactive DIMM of the volatile memory.

10. The controller of claim 7, comprising logic to:
identify one or more sections of the volatile memory which are in a modified state;
relocate data from the one or more sections of the volatile memory which are in the modified state; and
power down the one or more sections of the volatile memory.

11. The controller of claim 7, wherein the sections of volatile memory correspond to at least one of a cache line, a memory chip, a memory rank, or a memory bank.

12. The controller of claim 7, comprising logic to:
arrange the volatile memory such that read-only pages are located contiguously.

13. An electronic device, comprising:
a memory system comprising a plurality of direct in-line memory modules (DIMMS); and
a controller comprising logic to:
determine whether an electronic device is operating in a low power state; and
in response to a determination that the electronic device is operating in the low power state, determine whether a cache miss rate is below a threshold; and
in response to a determination that the cache miss rate is below the threshold:
identify one or more least recently used sections of the volatile memory which are in a modified state;
relocate data only from the one or more least recently used sections of a first DIMM of the volatile memory which are in the modified state to a subset of DIMMs in the volatile memory; and
power down the first DIMM of the volatile memory.

14. The electronic device of claim 13, wherein the controller comprises logic to:
identify one or more sections of the volatile memory which are in an invalid state; and
suspend refresh operations to the one or more sections of the volatile memory in the invalid state.

15. The electronic device of claim 13, wherein the controller comprises logic to:
identify one or more sections of the volatile memory which are in a modified state;
relocate data from the one or more sections of the volatile memory which are in the modified state; and
power down the one or more sections of the volatile memory.

16. The electronic device of claim 13, wherein the controller comprises logic to:
in response to a determination that the cache miss rate is not below the threshold:
activate at least one inactive DIMM of the volatile memory.

17. The electronic device of claim 13, wherein the sections of volatile memory correspond to at least one of a cache line, a memory chip, a memory rank, or a memory bank.

18. The electronic device of claim 13, wherein the controller comprises logic to:
arrange the volatile memory such that read-only pages are located contiguously.

19. A method to manage a memory system coupled to an electronic device, wherein the memory system comprises a volatile memory and a nonvolatile memory comprising a plurality of direct in-line memory modules (DIMMS), comprising:
determining, in a controller, whether an electronic device is operating in a low power state; and
in response to a determination that the electronic device is operating in the low power state, determining whether a cache miss rate is below a threshold; and
in response to a determination that the cache miss rate is below the threshold:
identifying one or more least recently used sections of a volatile memory which are in a modified state;
relocating data only from the one or more least recently used sections of a first DIMM of the volatile memory which are in the modified state to a subset of DIMMs in the volatile memory; and
powering down the first DIMM of the volatile memory.

20. The method of claim 19, further comprising:
identifying one or more sections of the volatile memory which are in an invalid state; and
suspending refresh operations to the one or more sections of the volatile memory in the invalid state.

21. The method of claim 19, further comprising:
identifying one or more sections of the volatile memory which are in a modified state;
relocating data from the one or more sections of the volatile memory which are in the modified state; and
powering down the one or more sections of the volatile memory module.

22. The method of claim 19, further comprising:
in response to a determination that the cache miss rate is not below the threshold:
activating at least one inactive DIMM of the volatile memory.

23. The method of claim 19, wherein the sections of volatile memory correspond to at least one of a cache line, a memory chip, a memory rank, or a memory bank.

24. The method of claim 19, further comprising:
arranging the volatile memory such that read-only pages are located contiguously.

* * * * *